United States Patent [19]

Chen et al.

[11] Patent Number: 5,040,183
[45] Date of Patent: Aug. 13, 1991

[54] APPARATUS COMPRISING OPTICAL PULSE-GENERATING MEANS

[75] Inventors: Young-Kai Chen, Berkeley Heights; Ming-Chiang Wu, Bridgewater, both of N.J.

[73] Assignee: AT&T Bell Laboratories, Murray Hill, N.J.

[21] Appl. No.: 553,311

[22] Filed: Jul. 20, 1990

[51] Int. Cl.$^5$ ............................................. H01S 3/103
[52] U.S. Cl. ...................................... 372/25; 372/45; 372/46; 372/50
[58] Field of Search ............................. 372/25, 43–48, 372/50, 11

[56] References Cited

U.S. PATENT DOCUMENTS

| | | | |
|---|---|---|---|
| 4,205,278 | 5/1980 | George et al. | 372/41 X |
| 4,400,814 | 8/1983 | Fork et al. | 372/94 |
| 4,517,675 | 5/1985 | Mourou et al. | 372/53 |
| 4,538,274 | 8/1985 | George | 372/3 |
| 4,727,553 | 2/1988 | Fork et al. | 372/25 |
| 4,860,296 | 8/1989 | Chemla et al. | 372/44 |
| 4,972,352 | 11/1990 | O'Dowd | 372/50 |

OTHER PUBLICATIONS

"Ultrashort Laser Pulses and Applications", edited by W. Kaiser, ISBN 3-540-18605-0 and ISBN 0-387-286-05-0, Springer-Verlag New York Berlin Heidelberg, pp. 5–34.
"40 GHz Active Mode-Locking in a 1-5 μm Monolithic Extended-Cavity Laser", by R. S. Tucker et al., Electronics Letters, May 11, 1989, vol. 25, No. 10, pp. 621–622.
"Monolithic Hybrid Mode-Locked 1.3 μm Semiconductor Lasers", by P. A. Morton et al., Applied Physics Letters, 56 (2), Jan. 8, 1990, pp. 111–113.
"Very Low Threshold InGaAs/InGaAsP Graded Index Separate Confinement Heterostructure Quantum Well Lasers Grown by Atmospheric Pressure Metalorganic Vapor Phase Epitaxy", by T. Tanbun-Ek et al., Applied Physics Letters, 55 (22), Nov. 27, 1989, pp. 2283–2285.
"Generation of Optical Pulses Shorter than 0.1 PSEC by Colliding Pulse Mode Locking", by R. L. Fork et al., Applied Physics Letters, 38(9), May 1, 1981, pp. 671–672.
"Mode Locking of Semiconductor Diode Lasers Using Saturable Excitonic Nonlinearities", by P. W. Smith et al., Journal of Optical Society of America B/vol. 2, No. 7, Jul. 1985, pp. 1228–1235.

Primary Examiner—Frank Gonzalez
Assistant Examiner—Galen Hansen
Attorney, Agent, or Firm—E. E. Pacher

[57] ABSTRACT

Disclosed is apparatus that comprises integrated colliding pulse mode-locked means for generating ultrashort optical pulses. The means advantageously are capable of producing transform-limited (or nearly transform-limited) pulses. Several exemplary embodiments are disclosed. Exemplarily the invention is embodied in InP-based integrated means that produced 1.4 ps pulses at a 32.6 GHz repetition rate.

8 Claims, 3 Drawing Sheets

APPARATUS COMPRISING OPTICAL PULSE-GENERATING MEANS

FIELD OF THE INVENTION

This invention pertains to semiconductor lasers, and to apparatus that utilizes semiconductor lasers as optical pulse source.

BACKGROUND OF THE INVENTION

Ultrashort optical pulses are of importance for many technological and scientific applications. One known technique for producing such pulses is generally referred to as mode-locking. See, for instance, the chapter by C. V. Shank in "Ultrashort Laser Pulses and Applications", W. Kaiser, editor, Springer Verlag 1988, pp. 5-34. In particular, mode-locked semiconductor lasers are likely to become increasingly important for, e.g., high speed optical communication systems, very high resolution optical time domain reflectometers, electro-optic sampling systems, and as clock signal source for high speed electronic circuits. Desirably the ultrashort pulses are "transform-limited", or nearly transform-limited, since transform-limited pulses require, for a given pulse length, the least bandwidth, and are likely to be able to propagate greater distance in optical fiber without suffering unacceptable distortion.

Although most mode-locked semiconductor lasers to date utilized external cavities, monolithic mode-locked semiconductor lasers are known. See R. S. Tucker et al., *Electronics Letters*, Vol. 25(10), pp. 621-622 (1989); and P. A. Morton et al., *Applied Physics Letters*, Vol. 56(2), pp. 111-113, (1990). Such monolithic lasers have obvious advantages in terms of, e.g., stability and size over non-monolithic ones. However, these prior art monolithic lasers have not succeeded in producing nearly (i.e., within a factor of two) transform-limited optical pulses.

The prior art knows many examples of the generation of ultrashort laser pulses by "colliding pulse mode-locked" (CPM) dye lasers. See, for instance, the above cited article by C. V. Shank. The CPM technique, when used with dye lasers, has succeeded in generating femtosecond transform-limited pulses. The central aspect of the CPM technique is the utilization of the interaction (frequently referred to as the "collision") of two counter-propagating optical pulses in an optical cavity to enhance the effectiveness of the "saturable absorber" commonly present in mode-locked lasers.

In view of the advantages associated with ultrashort optical pulses, a stable, efficient, small size solid state source, capable of producing transform-limited (or nearly transform-limited) pulses, would be of substantial importance. This application discloses such a source.

GLOSSARY AND DEFINITIONS

A pulse of radiation is herein considered to be "transform-limited" if the product of pulse width $\Delta t$ and bandwidth $\Delta \nu$ of the pulse is the theoretical minimum. As those skilled in the art know, the numerical value of the theoretical minimum depends on the pulse shape and can readily be computed for any given pulse shape.

A pulse herein is "nearly transform-limited" if $\Delta t \Delta \nu$ of the pulse is at most twice the transform-limited value.

By an "optical" pulse we mean herein a pulse of electro-magnetic radiation of wavelength in the visible or infrared portion of the spectrum.

SUMMARY OF THE INVENTION

In a broad aspect the invention is apparatus that comprises integrated means for generating optical pulses, said means being, at least in preferred embodiments, capable of producing nearly transform-limited optical pulses.

More specifically, the means for generating optical pulses comprise a semiconductor body that comprises integrated optical waveguide means that extend between first and second reflecting means, exemplarily cleaved facets (with or without coatings) or integrated grating mirrors (generally known as distributed Bragg reflectors). The waveguide means comprise electrical contact means overlying at least a portion of the waveguide means. Typically, the apparatus further comprises means for utilizing the optical pulses.

Significantly, the integrated optical waveguide means comprise a first and a second section and a "saturable absorber" section, the latter being located between the first and second reflecting means and being essentially symmetrical thereto. The first and second sections typically have substantially equal length and are located between the saturable absorber section and, respectively, the first and second reflecting means.

The electrical contact means comprise electrode means that overlie the saturable absorber section, and electrode means that overlie the first and second sections, respectively. If appropriate electrical power is applied to the contact means, at least one pair of counter-propagating optical pulses can be formed essentially simultaneously in the waveguide means, and the members of the pair can "collide" in the saturable absorber section, whereby pulse shortening can result.

In an exemplary embodiment of the inventive means for generating optical pulses the first and second sections are relatively short, are located close to the first and second reflecting means, respectively, and the electrode means overlying the first and second sections are electrically connected to each other and to a source of dc current. Optionally they are also connected to a source of radio frequencey (RF) current. Between the saturable absorber section and the first and second sections are third and fourth sections, respectively, defined by electrode means that overlie the third and fourth sections, respectively, and that are spaced from the other electrode means. In a further exemplary embodiment the waveguide means do not include third and fourth sections. The composition of the integrated waveguide means can be the same throughout the length of the waveguide means (i.e. from the first to the second reflecting means), or a portion (or portions) of the waveguide means can have a composition that differs from that of the rest. Exemplarily these portions of different compositions substantially extend between the saturable absorber section and the first and second sections, respectively. Advantageously, the portions comprise semiconductor material having a larger bandgap energy than the corresponding semiconductor material in the remainder of the waveguide means, whereby the optical loss and dispersion in these "passive" waveguide sections can be relatively low.

The discussion below will be primarily in terms of InP-based quantum well lasers. This is for the sake of concreteness only. Those skilled in the art will recognize that the invention can be embodied in devices based on other semiconductor systems (e.g., GaAs, InP, InGaAs/InAlAs, including strained material systems)

DETAILED DESCRIPTION

Figure 1:
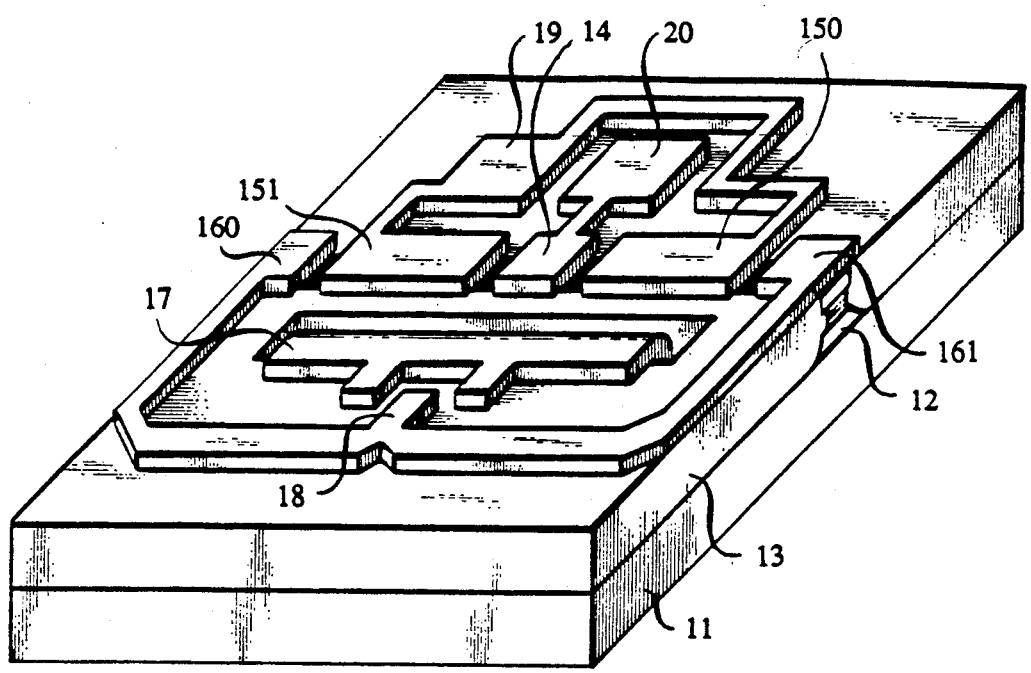
FIG. 1 schematically depicts an exemplary embodiment of the relevant part of means for generating optical pulses according to the invention.

FIG. 1 schematically depicts an exemplary embodiment of the invention, namely, a monolithic colliding pulse mode-locking (CPM) quantum well laser 10. The exemplary laser is a buried heterostructure (BH) laser that can be fabricated by means of known techniques, e.g. organometallic vapor phase epitaxy.

The structure 10 comprises an $n^+$InP substrate 11. Onto this substrate was grown a multilayer epitaxial structure, substantially as described in T. Tanbun-Ek et al., *Applied Physics Letters*, Vol. 55( 22), pp. 2283-85 (1989), incorporated herein by reference. The multilayer structure comprises four GaInAs quantum wells, and further comprises upper and lower graded index confinement layers. The multilayer structure was patterned by conventional means (including photolithography and etching) to form mesa 12, such that an about 1 $\mu$m wide active region resulted. The active region is surrounded by Fe-doped semiinsulating InP 13 to minimize parasitic capacitances. As indicated schematically in FIG. 1, the mesa 12 (and thus the active region) extends through the width of the structure 10, such as to minimize undesired optical reflections and to simplify fabrication. The length of the integrated optical waveguide formed by the mesa was 2.54 mm, corresponding to a round-trip frequency of about 16.3 GHz.

On the thus produced semiconductor body is formed a patterned metallization layer, with metal electrodes defining the various sections of the CPM laser. In particular, electrode 14 defines the saturable absorber section, electrodes 150 and 151 define the third and fourth sections, respectively, and electrodes 160 and 161 define the first and second sections, respectively. Electrodes 150 and 151 are electrically connected, as are electrodes 160 and 161. Electrode 17 permits contact to the substrate. Exemplarily, each of electrodes 14, 160 and 161 is about 70 $\mu$m wide, and the gaps between adjacent electrodes are about 10 $\mu$m. Thus, the absorber section is about 70 $\mu$m long, each of the third and fourth sections is about 1.145 mm long, and each of the first and second sections is about 70 $\mu$m long. Typical resistance between adjacent sections is about 2K$\Omega$. The cavity of the exemplary embodiment has symmetric mirrors formed by uncoated cleaved facets.

After heatsinking and grounding the device in conventional manner, counter-propagating pulses can be launched from the two generating sections, by, for instance, application of a dc bias with a superimposed RF current. In order to insure that the two pulses "collide" in the saturable absorber section, it is advantageous that the RF currents be in phase. This can be attained if the electrodes are fed symmetrically, e.g., by connecting RF current source means to symmetrically disposed contact tab 18, connected to the respective electrodes by means of microstrips, or co-planar waveguides. Separate sources of dc current are connected to the third and forth sections (at tab 19) and to the saturable absorber section (at tab 20), such that the currents in the three types of sections can be adjusted independently. Those skilled in the art will recognize that independent adjustability may not always be required, although it frequently may be a desirable feature.

Figure 5:
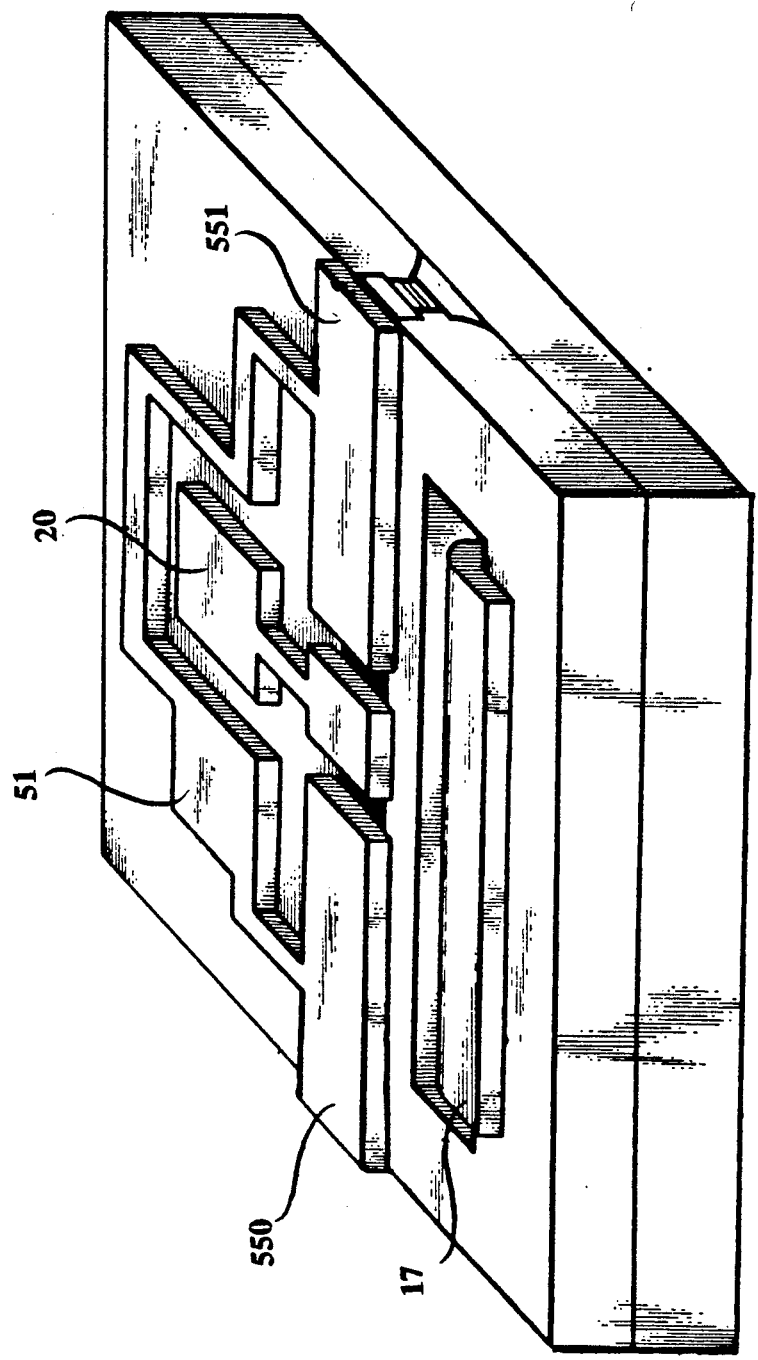
FIG. 5 schematically depicts a further exemplary embodiment of the relevant part of means for generating optical pulses according to the invention.

As those skilled in the art will appreciate, means to cause flow of a RF current are not necessarily required, since colliding pulses can result from the spontaneous fluctuations of the radiation field in the waveguide means. FIG. 5 schematically shows an exemplary embodiment adapted for generation of optical pulses without an RF signal. The embodiment is similar to that of FIG. 1, except that the electrodes 550 and 551 that define the first and second sections are extended inwardly, and that no third and fourth means are present. A source of dc current can be connected at contact pad 51, with 17 serving as ground contact.

However, the "active" portion of the waveguide means of FIG. 5 (i.e., the portion underlying electrodes 550 and 551) need not be such a large fraction of the total length of the waveguide means as is shown in FIG. 5, and in a still further exemplary embodiment the waveguide means comprise a substantial length (e.g., >25% of the total length) of "passive" waveguide means (i.e., portions of the waveguide means in which dc current is not caused to flow). Preferably, relatively long sections of passive waveguide means comprise material having larger bandgap energy than the material in the active sections of the waveguide means, such that attenuation in the passive sections is relatively low.

The CPM scheme depicted in FIG. 1 is believed to attain ultra-short pulses in the following way. Assuming that at time zero ($t=0$) two pulses are launched simultaneously from the first and second sections, then at one quarter of the round trip time $T(t=T/4)$, the two pulses have traveled to and are colliding at the saturable absorber section, where their collision results in the formation of a transient "grating". The transient grating diffracts back part of each light pulse, which adds coherently to the other pulse. This coherent interaction reduces the pulse width. At $t=T/2$, each given pulse is resonantly amplified by the (second or first) section at the other facet. Then the pulses collide again at $t=3T/4$. The CPM scheme of FIG. 5 is believed to operate analogously, except that resonant amplification through interaction with the RF does not occur. The above theoretical discussion is offered for tutorial purpose only and is not intended to limit the invention.

One of the important factors determining the pulse width lasers according to the invention is the response of the saturable absorber, with a fast saturable absorber contributing substantially to the formation of short pulses. It is known that in general the exciton absorption is saturated more effectively by the excitons themselves than by the free carriers the excitons decomposed to. At room temperature, the exciton lifetime in an III-V semiconductor such as GaAlAs is typically about 300 fsec. Thus a very fast saturable absorber can be realized by designing a quantum well laser according to the invention to operate at a frequency $\nu_o$ corresponding to $E_{ex}$, the energy of the exciton transition of the quantum well or wells. Thus, it is advantageous to make the quantum well or wells and the waveguide means such that $E_{ex}$ is approximately equal to (i.e., within ±10%) of $h\nu_o$, Where h is Planck's constant.

Figure 4:
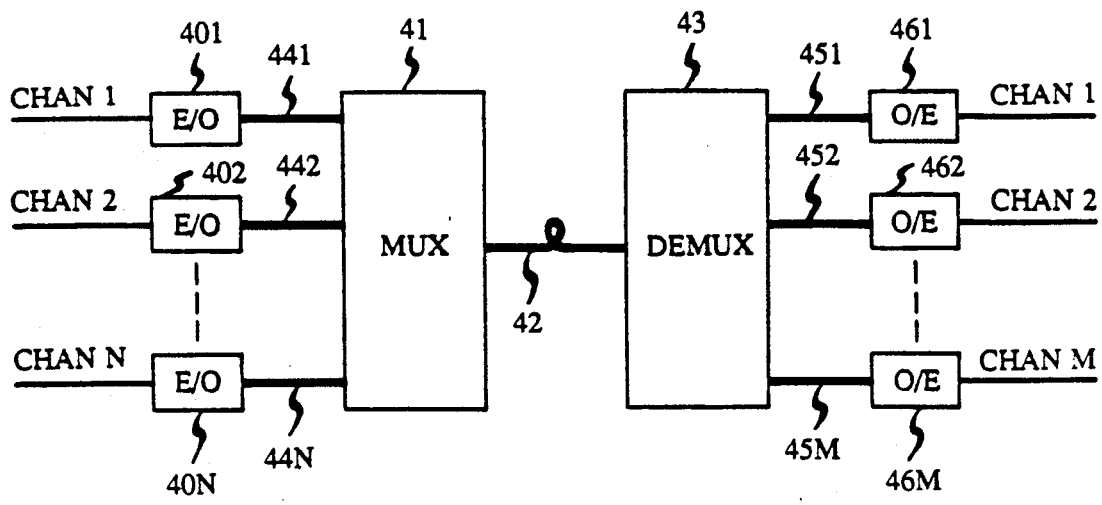
FIG. 4 schematically depicts exemplary apparatus according to the invention, namely, a time-division multiplexed optical fiber communication system which uses pulse generating means according to the invention to generate optical pulses.

Pulse generating means according to the invention can be incorporated into a wide variety of apparatus in place of conventional pulse generating laser means. Exemplary of such apparatus is a time-division multiplexed optical fiber communication system of the type that is schematically depicted in FIG. 4. In this figure, electrical signals on each of channels 1-N are converted to streams of optical pulses in electrical-to-optical (E/O) conversion means (401-40N), the resulting N streams of optical pulses travel on transmission means (441-44N; exemplarily optical fibers) to multiplexer 41, where they are combined into a single stream of optical pulses. This pulse stream is then coupled into transmission fiber 42 and transmitted to de-multiplexer 43 where it is de-multiplexed into M streams of optical pulses that are transmitted via transmission means 451-45M to the M (M not necessarily equal to N) optical-to-electrical (O/E) conversion means (461-46M). The resulting M streams of electrical pulses are then avaiable for utilization on channels 1-M. Whereas the O/E conversion means can be conventional, the E/O conversion means contain pulse generating means according to the invention. An exemplary prior art system of the type shown in FIG. 4 is disclosed in U.S. Pat. application Ser. No. 275,454, incorporated herein by reference.

Apparatus according to the invention is not limited to optical fiber communication systems. Those skilled in the art will be readily able to incorporate pulse generating means according to the invention into a wide variety of apparatus, thereby improving the characteristics of the apparatus.

EXAMPLE 1

A monolithic CPM quantum well laser substantially as described above and as shown in FIG. 1 was manufactured, substantially as described in Tanbun-Ek et al., op. cit. On a (100) n-InP substrate were grown in sequence: an n-InP buffer layer (1 μm thick, $3 \times 10^{18}$ S atoms/cm³); the lower part of the confining layer (step-like decreasing bandgap energy corresponding to wavelengths of 1.14 μm, 1.25 μm, 1.33 μm and 1.40 μm respectively, each sub-layer about 25 nm thick, undoped); 4 (strained) $In_{0.48}Ga_{0.52}As$ quantum well layers (each about 5 nm thick) with GaInAsp barriers (bandgap 1.40 μm, each about 22.5 nm thick) therebetween; the upper part of the confining layer (similar to the lower part but increasing in bandgap); an InP setback layer (50 nm thick, undoped) to minimize the effects of Zn diffusion; a p-InP cladding layer (1.5 μm thick, $3 \times 10^{17}$ Zn atoms/cm³); and a p-InGaAsP contact layer (120 nm thick, $4 \times 10^{18}$ Zn atoms/cm⁻³).

The laser was mounted for testing on a copper stud. The small signal response was measured with a HP 8510 network analyzer. The direct modulation bandwidth was found to be 2GHz, probably due to the long photon lifetime associated with the long cavity length. At higher frequencies the modulation response decreased monotonically until the frequency was close to the cavity resonance at 16.3 GHZ, where the response peaked up to about the 2 GHz level.

Figure 2:
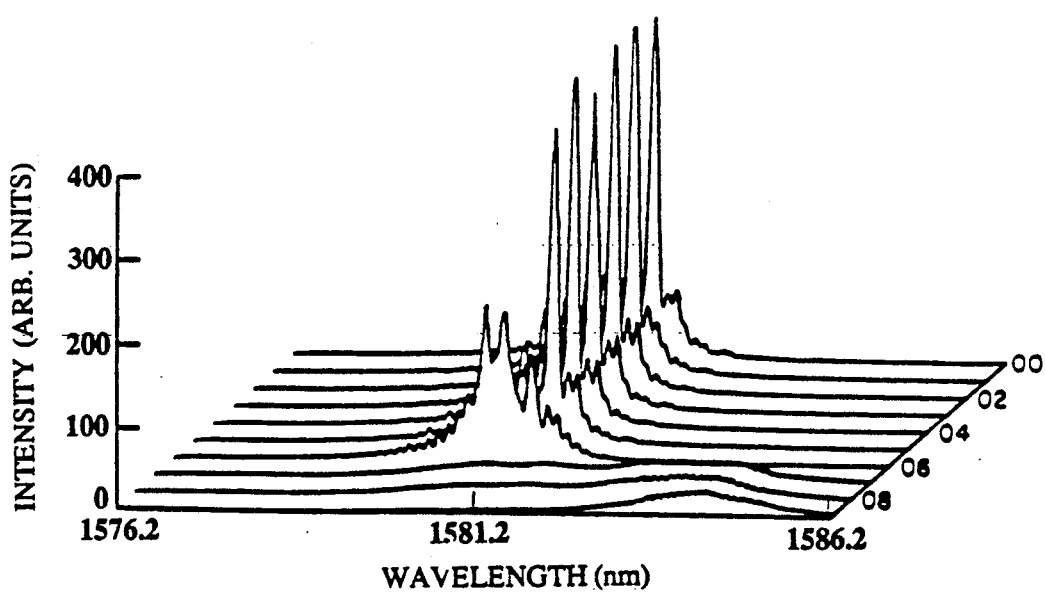
FIG. 2 shows experimental data on the intensity of the optical pulses emitted by pulse generating means of the type shown in FIG. 1.

For mode-locking measurements the RF signal was derived from a known low phase-noise synthesizer. The pulse width, the optical spectrum and the average output power were monitored simultaneously as the RF frequency was fine-tuned around 32.6 GHz under various bias conditions. The pulse width was measured by a non-collinear second harmonic autocorrelator using a 5 mm thick $LiNbO_3$ crystal. The spectrum and the power were monitored through an optical fiber butt-coupled to a facet of the laser. The pulse width was found to depend on RF frequency and power, and the dc biases. This is exemplified by FIG. 2, which shows the spectrum of the laser for various RF power levels at 32.6 GHz. At −25 dBm of RF power (trace 00) there is a dominant single longitudinal mode, similar to that in cw lasing. The spectrum can be seen to change at +5 dBm (trace 06), with significant change +10 dBm (trace 07), where a series of longitudinal modes, with peak heights suppressed by more than 10 dB, was observed, together with spectral width broadening to a couple of nanometers, and a shifting of the lasing wavelength from about 1.5812 μm to about 1.5844 μm.

Figure 3:
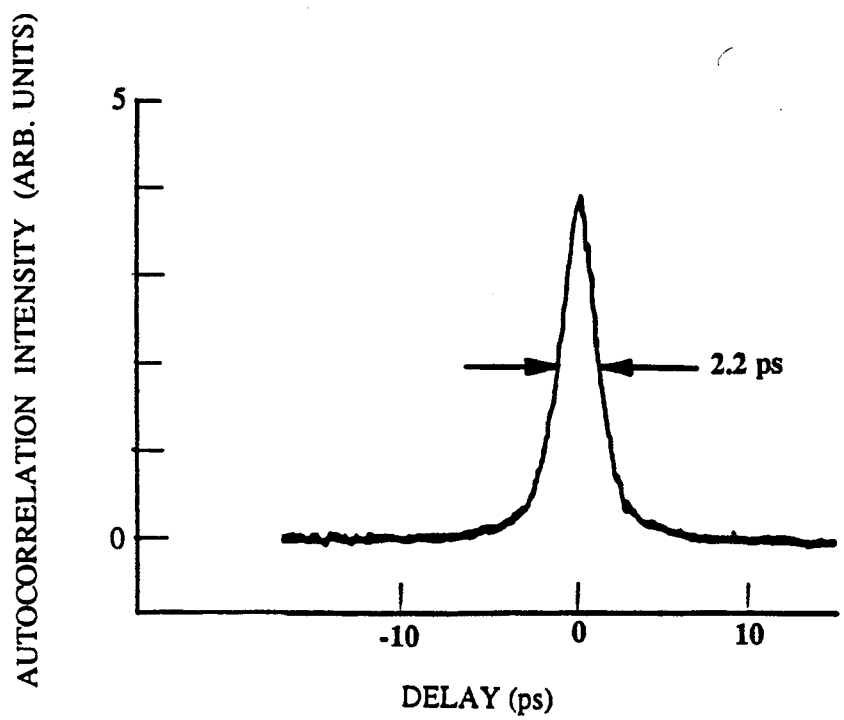
FIG. 3 shows autocorrelation data from pulses emited by pulse generating means of the type shown in FIG. 1.

The shortest pulse width was obtained when the third and fourth sections were biased just above threshold (exemplarily 94 mA), with the first and second sections and the saturable absorber section tied together through a bias-tee. Exemplary second harmonic autocorrelation intensity versus delay time data is shown in FIG. 3. The autocorrelation signal has a full width at half maximum of 2.2 ps, which translates (assuming a sech² pulse) into a pulse width of 1.4 ps. The modulation depth was nearly 100%, only a single pulse was observed in a RF cycle, the average optical output power was about 0.5 mW, and the peak power was about 10 mW. From the measured spectral width of 1.69 nm, the time-bandwidth product was calculated to be about 0.3, indicating that the 1.4 ps pulse was essentially transform limited (for a sech² transform limited pulse the theoretical value of the product is 0.31, as can be readily determined.

EXAMPLE 2

Monolithic CPM lasers of the type shown in FIG. 5, were manufactured substantially as described in Tanbun-Ek et al., op. cit. The lasers were 1.5 μm buried heterostructure GaInAsP graded index separate confinement lattice-strained multiple quantum well lasers. The lower part of the graded index confining InGaAsP layers were deposited on top of a 2 μm thick n-InP cladding layer, with step-like decreasing bandgap layers of 1.08 μm (25 nm thick), 1.16 μm (25 nm thick), and 1.25 μm (25 nm thick), and followed by five strained $In_{0.48}GA_{0.52}As$ quantum wells (5 nm thick) and 1.25 μm (22.5 nm thick) InGaAsP barriers. The upper graded index InGaAsP confining layers, similar to the lower part, were then grown with increasing bandgap, and followed by a 2 μm p-InP cladding layer and a 120 nm $p^+$-InGaAsP contact layer (Zn doped to $5 \times 10^{18}$ cm⁻³). After the 2 μm wide continuous waveguide strips were formed by etching down to the lower n-cladding layer, an iron-doped semi-insulating buried heterostructure InP layer was selectively grown around the waveguide strips to provide electric isolation and optical confinement. Standard lithography and wet chemical etching were used to construct the final structure, with the continuous optical waveguide divided into three sections (10 μm gaps) by the segmented p-contact metal strips. The electrical isolation between contact metals was achieved by removing the top heavily doped p-type contact epitaxial layer with wet chemical etching. Typical resistance between adjacent sections was 1K ohms. The 50 μm long saturable absorber was located in the symmetry center of the linear cavity between two uncoated cleaved Fabry-Perot facets. The remaining active cavity, connected together, was forward-biased as the gain section of the integrated CPM laser.

Devices of cavity length of 2.1, 1.0, and 0.534 mm were fabricated to generate optical pulses with repetition rates of 40, 80, and 160 GHz, respectively. The repetition rate corresponds, because of the CPM configuration, to one half of the round-trip time needed for a pulse to travel between two facets. Stable mode-locked operation was observed over broad bias combinations of $V_{abs}$ (the voltage applied to the absorber section) and $I_G$ (the current through the first and second sections). Pulses with full width at half maximum values of 1.1, 0.83,and 1.0 ps were obtained for lasers with cavity lengths of 2.1, 1.0 and 0.534 mm, respectively. The pulses were essentially transform limited. Since the pulse width typically cannot be less than the transit time of the optical pulse through the saturable absorber region, further reduction in pulse width would require further reduction in the length of the absorber section, advantageously together with use of integrated low dispersion passive waveguide sections.

We claim:

1. Apparatus comprising means for generating optical pulses, said means comprising a semiconductor body comprising integrated optical waveguide means extending between first and second reflecting means, electrical contact means overlying at least a portion of said optical waveguide means, and means for applying electrical power to the electrical contact means; the apparatus further comprising means for utilizing the optical pulses generated by the means for generating optical pulses; characterized in that
   a) the means for generating optical pulses are colliding pulse-type means;
   b) the integrated optical waveguide means comprises a first and a second section and a "saturable absorber" section, the latter being located intermediate the first and second reflecting means and essentially symmetrical thereto;
   c) the first and second sections have substantially equal length and are located intermediate the saturable absorber section and the first and second reflecting means, respectively; and
   d) said electrical contact means comprise electrode means that overlie said saturable absorber section and electrode means that overlie said first and second sections, respectively, such that, if electrical power is applied to said contact means, at least one pair of counter-propagating optical pulses can be formed essentially simultaneously in the integrated waveguide means and can collide in the saturable absorber section.

2. Apparatus of claim 1, wherein the integrated optical waveguide means comprise third and fourth sections located between the absorber section and, respectively, the first and second sections.

3. Apparatus of claim 1, wherein the means for applying electrical power comprise means for applying radiofrequency electrical power to the electrode means that overlie the first and second sections.

4. Apparatus of claim 1, wherein the integrated optical waveguide means comprise one or more quantum wells.

5. Apparatus of claim 1, wherein the composition of the integrated optical waveguide means is essentially invariant in a longitudinal direction.

6. Apparatus of claim 1, wherein the integrated optical waveguide means comprise a passive waveguide portion comprising semiconductor material having a larger bandgap energy than the semiconductor material in the first and second section.

7. Apparatus of claim 4, wherein associated with the one or more quantum wells is an exciton transition energy $E_{ex}$, associated with the integrated optical waveguide means being an operating frequency $\nu_o$, with the quantum well or wells and the waveguide means made such that $E_{ex}$, is approximately equal to $h\nu_o$, where h is Planck's constant.

8. Apparatus of claim 1, wherein the means for generating optical pulses are adapted for generating pulses that are at least nearly transform limited.

* * * * *